US012176961B2

(12) United States Patent
Jing et al.

(10) Patent No.: US 12,176,961 B2
(45) Date of Patent: Dec. 24, 2024

(54) SYSTEM AND METHOD FOR DETERMINING CORRECTED TOTAL RADIATED POWER (TRP) OR CORRECTED TOTAL ISOTROPIC SENSITIVITY (TIS) OF OFFSET ANTENNA UNDER TEST

(71) Applicant: Keysight Technologies, Inc., Santa Rosa, CA (US)

(72) Inventors: Ya Jing, Beijing (CN); Thorsten Hertel, San Jose, CA (US); Zhu Wen, Beijing (CN); Li Cao, Beijing (CN)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 18/031,835

(22) PCT Filed: Oct. 22, 2020

(86) PCT No.: PCT/CN2020/122908
§ 371 (c)(1),
(2) Date: Apr. 13, 2023

(87) PCT Pub. No.: WO2022/082635
PCT Pub. Date: Apr. 28, 2022

(65) Prior Publication Data
US 2024/0214080 A1    Jun. 27, 2024

(51) Int. Cl.
*H04B 17/10*  (2015.01)
*G01R 29/10*  (2006.01)
*H04B 17/11*  (2015.01)

(52) U.S. Cl.
CPC ........... *H04B 17/102* (2015.01); *G01R 29/10* (2013.01); *H04B 17/11* (2015.01)

(58) Field of Classification Search
None
See application file for complete search history.

(56) References Cited

U.S. PATENT DOCUMENTS 10,277,337 B2    4/2019  Bai
10,830,805 B2    11/2020  Derat et al.
(Continued)

FOREIGN PATENT DOCUMENTS

CN    101605350 A    12/2009
CN    104931811 A    9/2015
(Continued)

OTHER PUBLICATIONS

"DraftCR to TR38.810 to update TRP Measurement Grids Annex", 3GPP TSG-RAN WG4 Meeting #89, Nov. 12-16, 2018, pp. 1-14.
(Continued)

*Primary Examiner* — Wilson Lee

(57) ABSTRACT

A method determines corrected TRP or TIS of an AUT in a near-field test chamber, the AUT having a phase center offset from a rotation center of the test chamber. The method includes performing EIRP or EIS measurements of the AUT at first sampling grid points on a first closed-surface geometric shape centered at the rotation center; mapping second sampling grid points to the first closed-surface geometric shape to provide mapped sampling grid points on the first closed-surface geometric shape, where the second sampling grid points are on a second closed-surface geometric shape centered at the phase center of the AUT; determining estimated EIRPs or EISs at the mapped sampling grid points using the EIRP or EIS measurements; scaling the estimated EIRPs or EISs at the mapped sampling grid points to provide scaled EIRPs or EISs; and calculating the corrected TRP or TIS based on the scaled EIRPs or EISs.

20 Claims, 4 Drawing Sheets

(56) References Cited

U.S. PATENT DOCUMENTS

| | | | |
|---|---|---|---|
| 11,057,119 B2 | 7/2021 | Jing et al. | |
| 11,057,120 B2 | 7/2021 | Jing et al. | |
| 11,175,326 B2 | 11/2021 | Anton et al. | |
| 2013/0214971 A1* | 8/2013 | Robinson | H01Q 3/267 342/360 |
| 2013/0231060 A1 | 9/2013 | Ozaki et al. | |
| 2017/0303813 A1* | 10/2017 | Lattanzi | G01R 33/56 |
| 2018/0337738 A1 | 11/2018 | Wen et al. | |
| 2019/0020530 A1* | 1/2019 | Au | H04W 72/21 |
| 2019/0081713 A1* | 3/2019 | Elfström | H04B 17/101 |

FOREIGN PATENT DOCUMENTS

| | | |
|---|---|---|
| CN | 110149159 A | 8/2019 |
| JP | 2019-138687 A | 8/2019 |
| JP | 2020-122678 A | 8/2020 |
| WO | 2018059821 A1 | 4/2018 |

OTHER PUBLICATIONS

"Study on enhanced test methods for FR2 UEs", 3GPP TSG-RAN Meeting #85, Sep. 16-20, 2019, pp. 1-5.

International Search Report and Written Opinion for PCT/CN2020/122908, dated Jul. 29, 2021, pp. 1-9.

Gerhard F. Hamberger et al., "Correction of Over-the-Air Transmit and Receive Wireless Device Performance Errors Due to Displaced Antenna Positions in the Measurement Coordinate System", IEEE Transactions on Antennas and Propagation, 2020, vol. 68, Issue: 11, pp. 1-7.

"3rd Generation Patnership Project; Technical Specfication Group Radio Access Network; Study on new radio access technology; Radio Frequency (RF) and co-existence aspects (Release 14)," 3GPP TR 38.803, v14.2.0, Sep. 2017, 11 pgs.

Japanese Notice of Refusal dated Nov. 1, 2024, application No. 2023-524794, 12 pgs.

* cited by examiner

SYSTEM AND METHOD FOR DETERMINING CORRECTED TOTAL RADIATED POWER (TRP) OR CORRECTED TOTAL ISOTROPIC SENSITIVITY (TIS) OF OFFSET ANTENNA UNDER TEST

CROSS REFERENCE TO RELATED APPLICATIONS

The present application is the U.S. National Phase application under 35 U.S.C. § 371 of International Application No. PCT/CN2020/122908 filed on Oct. 22, 2020, and published as WO2022082635A1 on Apr. 28, 2022. The entire disclosure of PCT/CN2020/122908 is specifically incorporated by reference herein.

BACKGROUND

In testing wireless communication devices, a device under test (DUT) may have multiple antennas under test (AUTs), such as multiple antenna arrays, located at different positions on the DUT. For example, the DUT may have a first AUT for sending uplink (UL) transmissions for radio frequency (RF) signals, and a second AUT for receiving downlink (DL) transmissions of RF signals. Alternatively, the DUT might have multiple UL/DL antennas for multiple-input and multiple-output (MIMO) or diversity. The DUT may be tested in a test chamber using white box testing or black box testing for performing measurements in the radiative near-field or far-field. In white box testing, the array phase center of each antenna array being tested is aligned with the center of a quiet zone in the test chamber and the offsets of the array phase center of each antenna array are known. Black box testing, on the other hand, requires no prior knowledge of which antenna array is active or the detailed location of the active antenna array within the DUT relative to the quiet zone center of the test chamber. For example, the geometric center of the DUT may be aligned with the quiet zone center, in which case the AUTs themselves are offset from the quiet zone center by unknown amounts. For direct near-field and far-field test chambers, the black box testing can have a significant impact on measurements based on UL or DL power due to the unknown offset of the active antenna array from the center of the quiet zone. This offset can result in significant path loss differences and therefore result in significant differences for power-based metrics. Performing various measurements of the DUT is more difficult when the AUT is offset from the center of the quiet zone, particularly when the offset is by an unknown distance, thus requiring black-box testing.

Types of measurements adversely affected by the AUT offset include total radiated power (TRP), total isotropic sensitivity (TIS), equivalent isotropic radiated power (EIRP), and effective isotropic sensitivity (EIS). Notably, although EIRP and EIS traditionally describe radiated power and sensitivity measurements in the far-field, EIRP and EIS are used herein to describe radiated power and sensitivity measurements in the near-field as well, in order to simplify the explanation.

TRP is a common metric used to evaluate the total power radiated by the DUT, and TIS measures average sensitivity of transmitter and receiver system including the DUT. The TRP of a DUT may be calculated according to Equation (1), where $\theta$ is elevation angle and is $\phi$ azimuthal angle:

$$TRP = \oiint_S \frac{EIRP(\theta, \phi)}{4\pi} \sin\theta \cdot d\theta \cdot d\phi \quad (1)$$

$$TIS = \frac{4\pi}{\oiint \left[\frac{1}{EIS_\theta(\theta, \phi)} + \frac{1}{EIS_\phi(\theta, \phi)}\right] \sin(\theta) d\phi d\theta} \quad (2)$$

The integral function of Equation (1) is typically solved using numerical integration techniques. For example, the derivation from a closed surface TRP integral to a classical discretized summation equation used for over the air (OTA) transmissions is derived as shown in Equation (3):

$$TRP \approx \frac{\pi}{2NM} \sum_{i=1}^{N-1} \sum_{j=0}^{M-1} [EIRP_\theta(\theta_i, \phi_j) + EIRP_\phi(\theta_i, \phi_j)] \sin(\theta_i) \quad (3)$$

TIS is derived from Equation (2), as shown in Equation (4):

$$TIS \approx 1 / \left(\frac{\pi}{2NM} \sum_{i=1}^{N-1} \sum_{j=0}^{M-1} [1/EIS_\theta(\theta_i, \phi_j) + 1/EIS_\phi(\theta_i, \phi_j)] \sin(\theta_i)\right) \quad (4)$$

However, Equations (3) and (4), as well as other conventional numerical integration techniques, do not consider the degraded accuracy of the TRP or TIS calculation caused by the offset of the AUT from the quiet zone center in the test chamber. The TRP measurement uncertainty in particular increases for AUT measurements in the near-field since the AUTs offsets are no longer a small fraction of the measurement distance.

Generally, an offset of the AUT is less of an issue for far-field measurements than for near-field measurements since the offset distance of the AUT is typically relatively small compared to the far-field measurement distance. However, there are a number of drawbacks to performing far-field measurements. For measurement solutions based on the DFF measurements, for example, 5G base stations and user equipment utilize large antenna arrays to support massive MIMO functionality. This requires very large measurement distances for the far-field OTA measurements, and thus very large anechoic chambers for performing the OTA measurements. Such large anechoic chambers are expensive to setup, and may challenge space requirements, as a practical matter. Further, the larger far-field measurement distances result in larger propagation losses, which are another challenge to accurate OTA measurements, especially for high downlink power and low uplink power test cases. So, near-field measurements may be more desirable.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
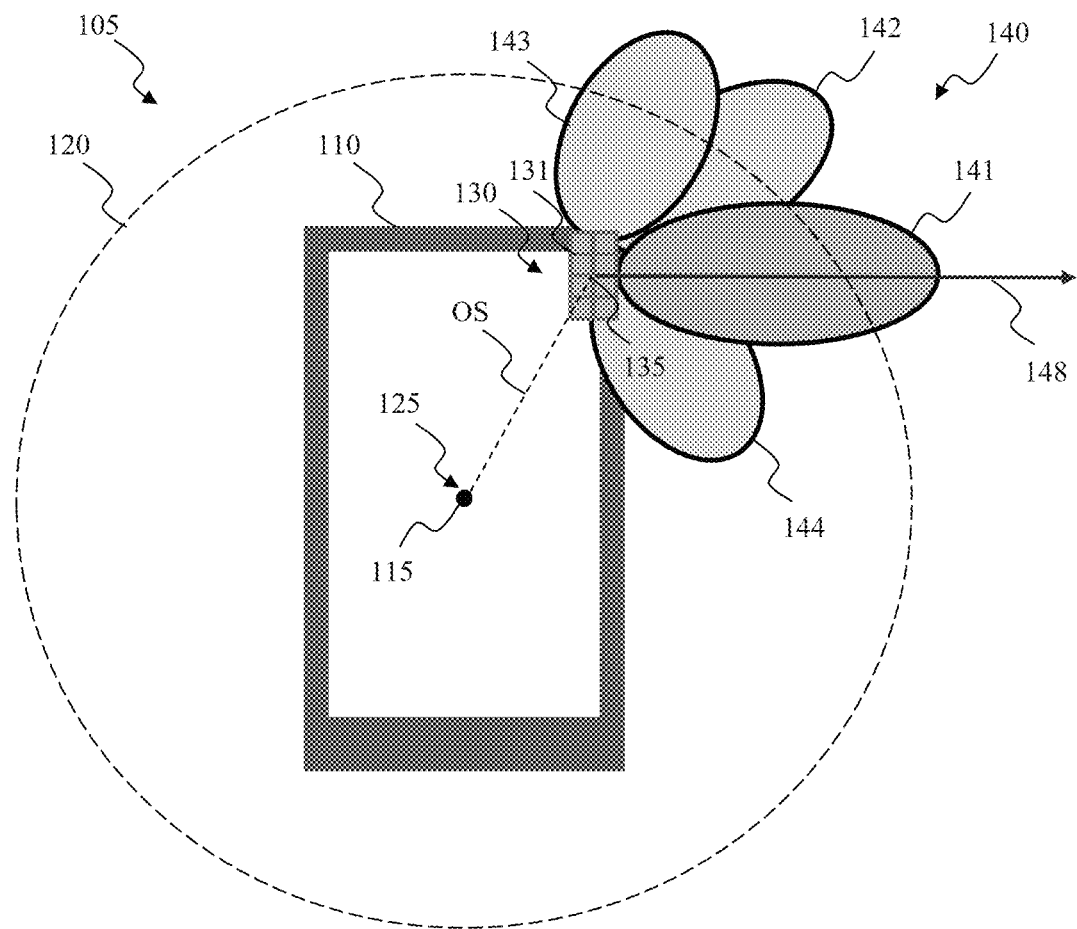
FIG. 1 is a simplified block diagram of a device under test (DUT) having an antenna under test (AUT) offset from a quiet zone center of a test chamber, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, according to various embodiments, total radiated power (TRP), equivalent isotropic radiated power (EIRP) and/or effective isotropic sensitivity (EIS) of a device under test (DUT) may be determined in a near-field test chamber, where the DUT has at least one antenna under test (AUT) that is offset from a center of a quiet zone of the near-field test chamber. Other measurements such as transmission signal quality (EVM) are not precluded.

FIG. 1 is a simplified block diagram of a DUT having an AUT offset from a quiet zone center of a test chamber, according to a representative embodiment.

Referring to FIG. 1, a DUT 110 is positioned in a quiet zone 120 of a near-field test chamber 105. The geometric center 115 of the DUT 110 is aligned with a quiet zone center 125 of the quiet zone 120. The DUT 110 includes a representative AUT 130, which is located on an outside edge of the DUT 110, away from the geometric center 115. The AUT 130 has beamforming capability. In the depicted embodiment, the AUT 130 includes an antenna array 131 having antenna pattern 140. For purposes of illustration, and not limitation, the antenna array 131 includes eight antenna elements arranged in a 2×4 array, and has an array phase center 135 at the physical and/or electronic center of the 2×4 array. The array phase center 135 is offset from the quiet zone center 125 by an offset OS at an angle and distance from the quiet zone center 125 to the array phase center 135 of the antenna array 131 at an offset location. The amount of the offset may be known or unknown, depending on the embodiment described herein. Accordingly, measurements of the AUT 130, such as the TRP, the EIRP and/or the EIS, for example, are performed according to black box testing. Of course, the antenna array 131 may include more or fewer antenna elements arranged in various patterns, without departing from the scope of the present teachings. Also, the AUT 130 may be an uplink and/or downlink antenna.

Each antenna element of the antenna array 131 may have a large number of codebooks, resulting in the antenna pattern 140 having different beams, indicated by representative first beam 141, second beam 142, third beam 143 and fourth beam 144. For conformance testing, for example, only the beam with the best performance needs to be evaluated, and this beam is locked before performing an integration over the antenna pattern of the AUT 130 to prevent the DUT 110 from selecting different beams during the measurement. The best beam is typically the beam with the best EIRP or EIS performance in the declared test direction in the far-field. Each of the first through fourth beams 141-144 has a corresponding beam peak direction from the array phase center 135. The beam peak direction 148 of the first beam 141 is shown by an arrow that extends substantially perpendicularly to the antenna array 131 in the depicted example.

Figure 2:
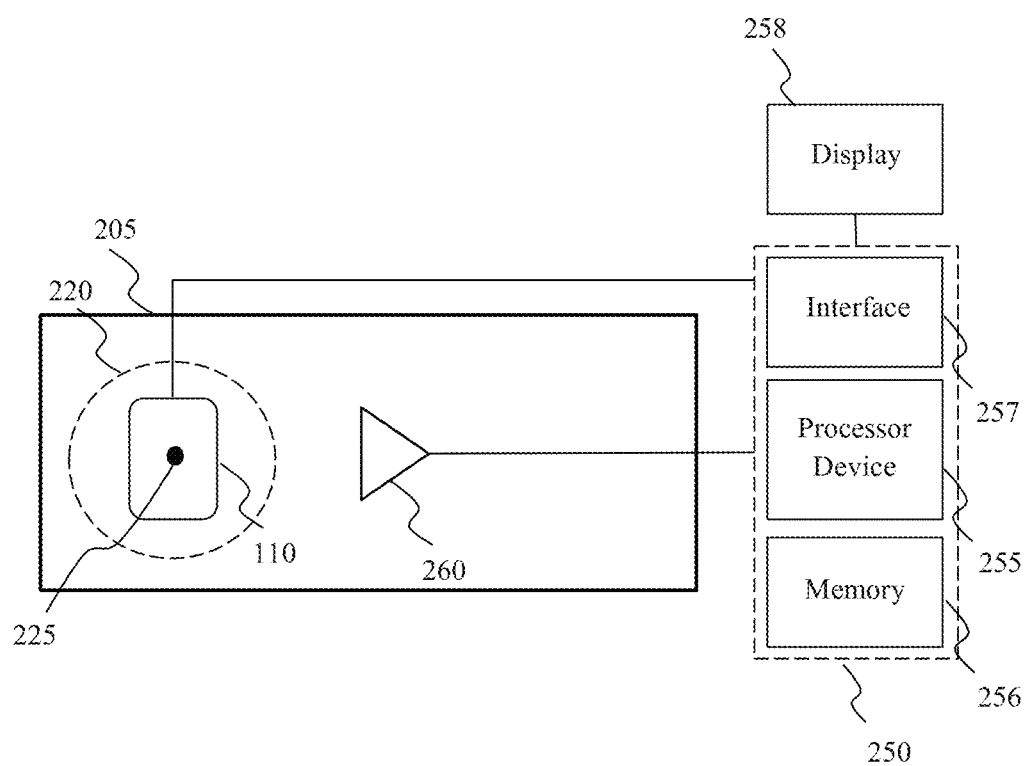
FIG. 2 is a simplified block diagram showing a test system for performing EIRP or EIS measurements and determining TRP or TIS of a DUT including at least one AUT that is offset from a quiet zone center, according to a representative embodiment.

FIG. 2 is a simplified block diagram showing a test system for performing EIRP or EIS measurements and determining TRP or TIS of a DUT including at least one AUT that is offset from a quiet zone center, according to a representative embodiment. Again, EIRP and EIS as used herein refer to measurements of radiated power and sensitivity, respectively, in the near-field as well as the far-field.

Referring to FIG. 2, a system 200 includes a test chamber 205 and a processing unit 250 in communication with the test chamber 205. The test chamber 205 may be an anechoic chamber, for example. The DUT 110 is located in a quiet zone (not shown) of the test chamber 205, and includes the AUT 130 offset from the center of the quiet zone, as discussed above. In the depicted example, the test chamber 205 includes at least one near-field probe antenna, indicated by a near-field probe antenna 260. The test chamber 205 may also include a far-field probe antenna (not shown) to introduce a far-field environment at the DUT 110, for instance a conventional probe antenna placed in the far-field or a compact antenna test range reflector-based methodology. The probe antenna 260 may be movable to different locations within test chamber 205, in both lateral and radial directions relative to the DUT 110, and may have varying range lengths. In an embodiment, the test chamber 205 may be a near-field test chamber or a far-field test chamber with at least one near-field probe antenna located in the near-field, without departing from the scope of the present teachings.

The processing unit 250 includes a processor device 255, memory 256, and an interface 257, together with a display 258. The processor device 255, together with the memory 256, implements the methods of determining at least one of the TRP, the EIRP and the EIS of the DUT 110 in the test chamber 205, and may be configured to perform and/or control all or a portion of the steps of the processes shown in FIGS. 4 and 8, discussed below. In various embodiments, the processor device 255 may include a general purpose computer, a central processing unit (CPU), one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to a processor should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices. The processor device 255 may have its own memory (not shown), and is in communication with the memory 256.

The memory 256 stores instructions/computer readable code (e.g., software, software modules) that enables performance of the various functions described herein. For example, the memory 256 may store software instructions/computer readable code executable by the processor device 255 (e.g., computer processor) for performing some or all aspects of methods described herein. The memory 256 may be implemented by any number, type and combination of random access memory (RAM) and read-only memory (ROM), for example, and may store various types of information, such as software algorithms, AI models including ANN and other neural network based models, and computer programs, all of which are executable by the processor device 255. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art. The memory 256 may be secure and/or encrypted, or unsecure and/or unencrypted. The memory 256 is representative of one or more memories and databases, including the processing memory, as well as multiple memories and databases, including distributed and networked memories and databases.

The memory 256 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 256 may store software instructions and/or computer readable code that enable performance of various functions. The terms "memory" and "database" are examples of computer-readable storage media, and should be interpreted as possibly being multiple memories or databases. The memory or database may for instance be multiple memories or databases local to the computer, and/or distributed amongst multiple computer systems or computing devices.

The interface 257 may include a user interface and/or a network interface for providing information and data output by the processor device 255 and/or the memory 256 to the user and/or for receiving information and data input by the user. That is, the interface 257 enables the user to enter data and to control or manipulate aspects of the process determining the EIRP and/or EIS of the DUT, and also enables the processor device 255 to indicate the effects of the user's control or manipulation (e.g., on the display 258). The interface 257 may include one or more of ports, disk drives, wireless antennas, or other types of receiver circuitry. The interface 257 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 250.

The display 258 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 258 may also provide a graphical user interface (GUI) for displaying and receiving information to and from the user. The interface 257 may include a user and/or network interface for providing information and data output by the processor device 255 and/or the memory 256 to the user and/or for receiving information and data input by the user. That is, the interface 257 enables the user to enter data and to control or manipulate aspects of the processes described herein, and also enables the processor device 255 to indicate the effects of the user's control or manipulation. The interface 257 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example.

TRP and TIS measurement accuracy is negatively affected when the antenna array phase center of an AUT is offset (not aligned with) the measurement system rotation center (quiet zone center) of the test chamber, when the offset size is not negligible compared with test distance. This is particularly the case for TRP measurements in the near-field, which may be more sensitive to antenna array offset. The embodiments below are discussed with regard to determining TRP for the sake of convenience. However, it is understood that they may apply equally to determining TIS.

Figure 3:
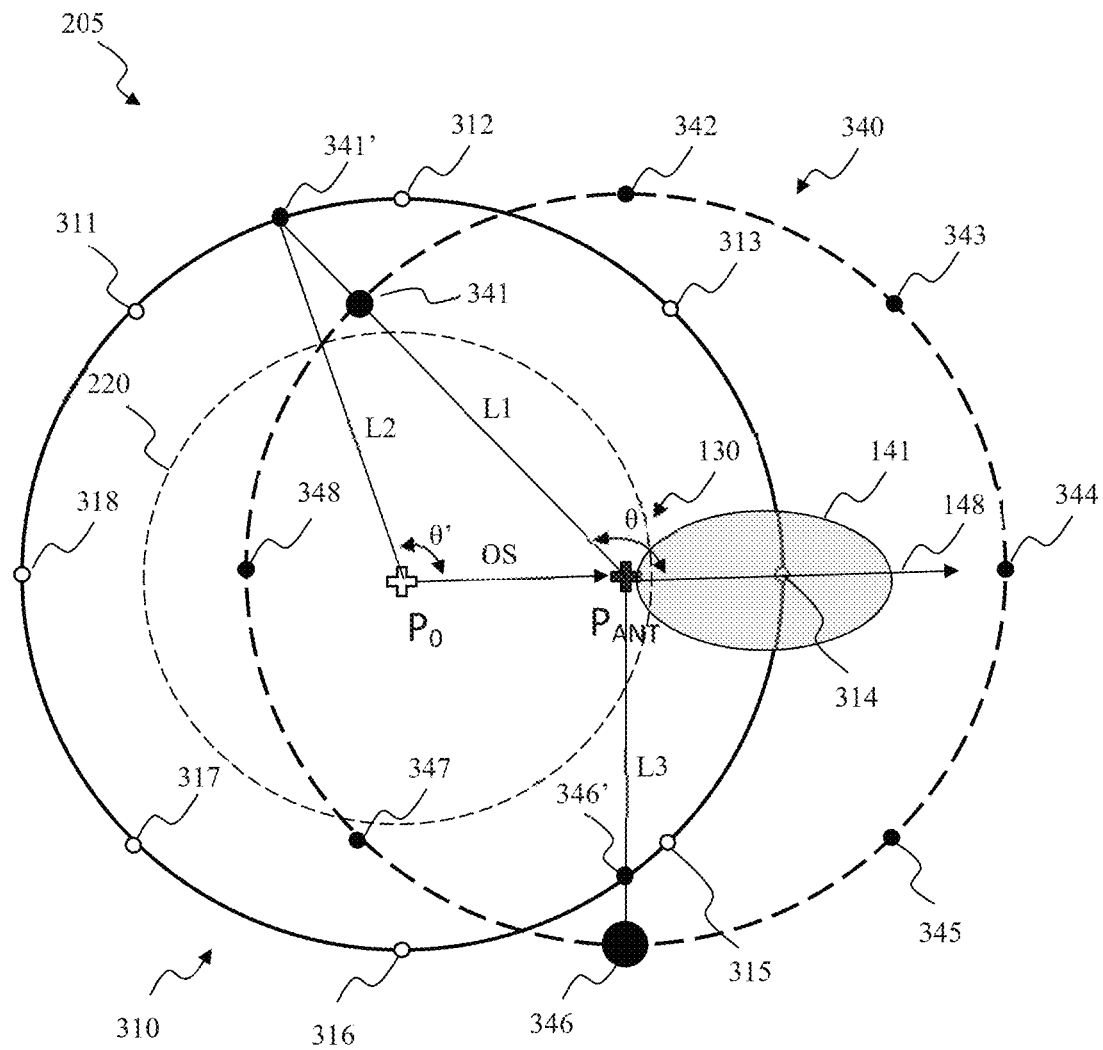
FIG. 3 is a schematic diagram of an AUT with TRP or TIS grid points around the center of a quiet zone center of a test chamber and around the array phase center of the AUT, according to a representative embodiment.

FIG. 3 is a simplified block diagram of an AUT with TRP or TIS grid points around the center of a quiet zone center of a test chamber and around the array phase center of the AUT, according to a representative embodiment.

Referring to FIG. 3, an AUT 130 is positioned inside the quiet zone 220 of the test chamber 205, discussed above. The quiet zone 220 includes quiet zone center $P_0$ at its center, which may also be referred to as the rotation center of the test chamber 205. The AUT 130 may be an antenna array, for example, having an array phase center $P_{ANT}$ that is offset from the quiet zone center $P_0$ by a known offset OS. That is, the offset OS may be declared in advance, e.g., by the manufacturer or user, or may be determined using any known technique. The AUT 130 may be an uplink and/or downlink antenna.

In order to determine the TRP or TIS of the AUT 130, first sampling grid points are arranged on a first closed-surface geometric shape 310 having a geometric center at the quiet zone center $P_0$. The first sampling grid points may be arranged on the first closed-surface geometric shape 310 using constant step size or constant density. A constant step size grid type has the azimuth and elevation angles uniformly distributed over the surface of the closed-surface geometric shape, and the constant density grid type has measurement points that are evenly distributed on the surface of the closed-surface geometric shape. In the depicted embodiment, the first closed-surface geometric shape 310 is a first sphere, and the first sampling grid points are indicated by eight evenly distributed sampling grid points 311, 312, 313, 314, 315, 316, 317 and 318 around the first sphere.

Likewise, second sampling grid points are arranged on a second closed-surface geometric shape 340 having a geometric center at the array phase center $P_{ANT}$. There is no limitation on placement of the second sampling grid points arranged on a second closed-surface geometric shape 340, such that placement of the second sampling grid points and grid density of the second sampling grid points on the second closed-surface geometric shape 340 is arbitrary. Therefore, the second sampling grid points do not need to follow the same grid type or grid spacing and/or density as the first sampling grid points arranged on the first closed-surface geometric shape 310. In the depicted embodiment, the second closed-surface geometric shape 340 is a second sphere, and the second sampling grid points are indicated by eight evenly spaced second sampling grid points 341, 342, 343, 344, 345, 346, 347 and 348 around the second sphere. Of course, the first and second closed-surface geometric shapes 310 and 340 may be shapes other than spheres without departing from the scope of the present teachings. Also, the first and second closed-surface geometric shapes 310 and 340 may be the same or different shapes and sizes from one another. Likewise, there may be fewer or more than eight first and second sampling grid points, respectively, without departing from the scope of the present teachings. It is further understood that, although shown in just two dimensions, the first and second sampling grid points may be arranged in three dimensions on the first and second closed-surface geometric shapes, respectively.

The EIRP or the EIS of the AUT 130 is measured at each of the first sampling grid points 311-318 in the near-field test chamber 205. The EIRP or the EIS of the AUT 130 may be measured using one or more probe antennas, such as the probe antenna 260, for example, by moving the probe antenna 260 to the locations of the first sampling grid points or by moving the DUT 110 so that the position of probe antenna 260 relative to the AUT 130 is at each of the first sampling grid points. When determining the TRP of the AUT 130, the EIRP is measured at each of the first sampling grid points 311-318, and when determining the TIS of the AUT 130, the EIS is measured at each of the first sampling grid points 311-318.

Each of the second sampling grid points 341-348 are mapped from the second closed-surface geometric shape 340 to the first closed-surface geometric shape 310, using distance and angle information of the offset OS from the array phase center $P_{ANT}$ to each of the second sampling grid points 341-348, respectively. As stated above, the placement of second sampling grid points 341-348 and the grid density of the second sampling grid points 341-348 on the second closed-surface geometric shape 340 are arbitrary. For purposes of illustration, FIG. 3 shows the second sampling grid point 341 mapped from the second closed-surface geometric shape 340 to the first closed-surface geometric shape 310 by drawing a line L1 from the array phase center $P_{ANT}$ through the second sampling grid point 341 to the first closed-surface geometric shape 310. The resulting point on the first closed-surface geometric shape 310 is indicated by mapped sampling grid point 341'. Likewise, the second sampling grid point 346 is mapped from the second closed-surface geometric shape 340 to the first closed-surface geometric shape 310 by drawing the line L3 from the array phase center $P_{ANT}$ through the second sampling grid point 346 to the first closed-surface geometric shape 310. The resulting point on the first closed-surface geometric shape 310 is indicated by mapped sampling grid point 346'.

Mapping the second sampling grid point 341, for example, to the closed-surface first geometric shape 310 includes determining the elevation and azimuthal angles from the array phase center $P_{ANT}$ to the second sampling grid point 341, and the elevation and azimuthal angles from the quiet zone center $P_0$ to the mapped sampling grid point 341' in three dimensions. As shown in two dimensions in FIG. 3, the elevation angle θ is shown by the line L1 extending from the array phase center $P_{ANT}$ of the AUT 130 through the second sampling grid point 341 to the to the first closed-surface geometric shape 310. The mapped sampling grid point 341' is placed on the first closed-surface geometric shape 310 where the line L1 intersects the first closed-surface geometric shape 310 at the determined elevation angle θ. The elevation angle θ' is shown by line L2 extending from the quiet zone center $P_0$ and the mapped sampling grid point 341'. From the mathematical calculation of the elevation and azimuthal angles θ and φ for the second sampling grid point 341 and the offset information, new elevation and azimuthal angles θ' and φ' for the mapped sampling grid point 341' may be calculated.

The line L1 from the array phase center $P_{ANT}$ through the second sampling grid point 341, if extended in the opposite direction, may intersect the first closed-surface geometric shape 310 at two points. In this case, the mapped sampling grid point is placed on the first closed-surface geometric shape 310 at the one of the two points that is closer to the initial second sampling grid point 341 (which in the depicted example would be the mapped sampling grid point 341', as shown).

Once the mapped sampling grid points 341' and 346' are positioned on the first closed-surface geometric shape 310, estimated EIRPs or EISs of the AUT 130 are determined at the mapped sampling grid points 341' and 346' by interpolating between measured EIRPs or EISs from among the first sampling grid points 311-318. For example, the estimated EIRP or EIS of the mapped sampling grid point 341' may be a simple interpolation between the EIRPs or EISs of the immediately adjacent first sampling grid points 311 and 312. Likewise, the estimated EIRP or EIS of the mapped sampling grid point 346' may be a simple interpolation between the EIRPs or EISs of the immediately adjacent first sampling grid points 315 and 316. Of course other interpolation techniques, as well as other techniques for estimating the EIRPs or EISs of the mapped sampling grid points, may be incorporated without departing from the scope of the present teachings. The process is repeated for each of the remaining second sampling grid points 342-345 and 347-348, which are individually mapped to the first closed-surface geometric shape 310, and for which corresponding estimated EIRPs or EISs are determined by interpolating between appropriate measured EIRPs or EISs of the first sampling grid points 311-318.

The estimated EIRPs or the estimated EISs at the mapped sampling grid points corresponding to the second sampling grid points 341-348 are scaled to provide corresponding scaled EIRPs or scaled EISs at each of the second sampling grid points 341-348 on the second closed-surface geometric shape 340. The scaling provides weights for the EIRPs or the EISs at the second sampling grid points 341-348, respectively. The scaled EIRPs or the scaled EISs are indicated by different sizes of the second sampling grid points 341 and 346 in the depicted example, corresponding to the respective values of the scaled EIRPs or the scaled EISs. That is, the value of the scaled EIRP or the scaled EIS at the second sampling grid point 346 is greater than the value of the scaled EIRP or the scaled EIS at the second sampling grid point 341, as indicated by the larger dot at the second sampling grid point 346. Generally, the scaling compensates for path loss error from the array phase center $P_{ANT}$ to each of the mapped sampling grid points.

In an embodiment, scaling the estimated EIRPs or the estimated EISs at the mapped sampling grid points includes determining ratios of (i) first distances between the array phase center $P_{ANT}$ and each of the mapped sampling grid points, respectively, and (ii) second distances between the quiet zone center and each of the mapped sampling grid points, respectively. Each of the ratios is multiplied with the estimated EIRPs or the estimated EISs at the mapped sampling grid points, respectively. So, for example, scaling the estimated EIRP or the estimated EIS at the mapped sampling grid point 341' may be done by determining the ratio of the lines L1 and L2, and multiplying the estimated EIRP or the estimated EIS at the mapped sampling grid point 341' by the ratio.

The corrected TRP or the corrected TIS of the AUT 130 is then calculated based on the scaled EIRPs or the scaled EISs at the second sampling grid points 341-348 on the second closed-surface geometric shape 340, respectively. The corrected TRP and the corrected TIS are accurate regardless of the AUT 130 being offset from the quiet zone center $P_0$, since the offset OS has been accounted for.

Figure 4:
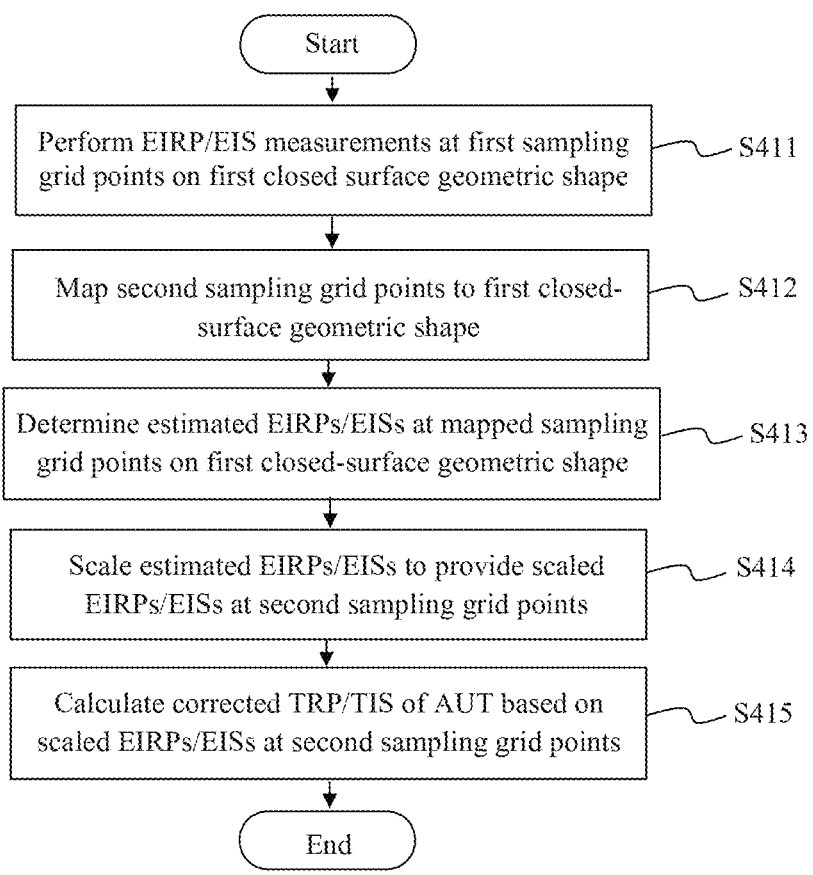
FIG. 4 is a flow diagram illustrating a method of determining a corrected TRP and/or TIS of an AUT in a near-field test chamber, according to a representative embodiment.

FIG. 4 is a simplified flow diagram illustrating a method of determining corrected TRP or TIS of an AUT in a near-field test chamber, according to a representative embodiment. As discussed above, the AUT includes an antenna array that has an array phase center that is offset from a center of a quiet zone of the near-field test chamber by a known offset. For example, the geometric center of the DUT may be aligned with the center of the quiet zone, while one or more AUTs are positioned at outer portions of the DUT, offset from the center of the quiet zone. The method may be implemented by the processing unit 250, for example, where the method steps are provided as instructions stored in the memory 256 and executable by the processor device 255.

Referring to FIG. 4, EIRP or EIS measurements of the AUT are performed at multiple first sampling grid points (e.g., first sampling grid points 311-318), respectively, in block S411. The first sampling grid points are arranged on a first closed-surface geometric shape (e.g., first closed-surface geometric shape 310) that has a corresponding first center located at the quiet zone center (rotation center) of the quiet zone in the test chamber.

In block S412, multiple second sampling grid points, which are arranged on a second closed-surface geometric shape (e.g., second closed-surface geometric shape 340), are mapped to the first closed-surface geometric shape to provide corresponding mapped sampling grid points on the first closed-surface geometric shape, respectively. The second closed-surface geometric shape has a second center located at the array phase center of the AUT. In an embodiment, the first and second closed-surface geometric shapes comprise first and second spheres, respectively.

In an embodiment, mapping the second sampling grid points from the second closed-surface geometric shape to the first closed-surface geometric shape determining an angle between a direction of the offset from the quiet zone center of the test chamber and a line extending from the array phase center of the AUT through each of the second sampling grid points, respectively, to the first sphere, and placing each mapped sampling grid point on the first sphere where the line intersects the first sphere at the determined angle, respectively. When the line from the array phase center of the AUT through a second sampling grid point intersects the first sphere at two points, the mapped sampling grid point is placed on the first sphere at the one of the two points that is closer to the corresponding second sampling grid point.

In block S413, estimated EIRPs or estimated EISs of the AUT are determined at the mapped sampling grid points using the EIRP measurements or the EIRP measurements preformed in block S411 at one or more first sampling grid points on the first closed-surface geometric shape. For example, the estimated EIRP or the estimated EIS of each of the mapped sampling grid points may be estimated by interpolating between the EIRPs or the EISs of the two immediately adjacent first sampling grid points on either side of the mapped sampling grid point. Of course, any other suitable type of interpolation may be incorporated, without departing from the scope of the present teachings.

The estimated EIRPs or the estimated EISs at the mapped sampling grid points are scaled in block S414 to provide scaled EIRPs or scaled EISs at the second sampling grid points on the second closed-surface geometric shape, respectively. As mentioned above, the scaling compensates for path loss error. In an embodiment, scaling the estimated EIRPs or the estimated ESs at the mapped sampling grid points includes determining ratios of (i) first distances between the array phase center and each of the mapped sampling grid points, respectively, and (ii) second distances between the quiet zone center and each of the mapped sampling grid points, respectively. Each of the ratios is multiplied with the estimated EIRPs or the estimated EISs at the mapped sampling grid points, respectively. Scaling the estimated EIRPs or the estimated EISs at the mapped sampling grid points may further include compensating for off-axis differences in antenna gain of a probe antenna, used for performing the EIRP measurements or the EIS measurements of the AUT at the first sampling grid points, respectively. The antenna gain is different for different directions between the probe antenna and the first sampling grid points, respectively.

In block S415, the corrected TRP or the corrected TIS of the AUT is calculated based on the scaled EIRPs or the scaled EISs at the second sampling grid points on the second closed-surface geometric shape, respectively. The corrected TRP may be calculated using the scaled EIRPs in Equations (1) and (3), above. The corrected TIS may be calculated using the scaled EISs in Equations (2) and (4), above. The corrected TRP and the corrected TIS have improved accuracy over the TRP and the TIS measured directly from the first sampling grid points, respectively.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of determining corrected total radiated power (TRP) or corrected total isotropic sensitivity (TIS) of an antenna under test (AUT) in a near-field test chamber, the AUT having a phase center that is offset from a rotation center of the test chamber, the method comprising:

performing equivalent isotropic radiated power (EIRP) measurements or effective isotropic sensitivity (EIS) measurements of the AUT at a plurality of first sampling grid points, respectively, wherein the plurality of first sampling grid points are arranged according to a constant step size or a constant density on a first closed-surface geometric shape centered at the rotation center of the test chamber;

mapping a plurality of second sampling grid points to the first closed-surface geometric shape to provide a plurality of mapped sampling grid points on the first closed-surface geometric shape, respectively, wherein the plurality of second sampling grid points are arranged on a second closed-surface geometric shape centered at the phase center of the AUT;

determining estimated EIRPs or estimated EISs of the AUT at the plurality of mapped sampling grid points using the EIRP measurements or EIS measurements at one or more first sampling grid points of the plurality of first sampling grid points;

scaling the estimated EIRPs or the estimated EISs at the plurality of mapped sampling grid points to provide scaled EIRPs or the estimated EISs or scaled EISs at the plurality of second sampling grid points on the second closed-surface geometric shape, respectively, wherein the scaling compensates for path loss error; and calculating the corrected TRP or the corrected TIS of the AUT based on the scaled EIRPs or the scaled EISs, respectively, at the plurality of second sampling grid points on the second closed-surface geometric shape.

2. The method of claim 1, wherein determining the estimated EIRPs or the estimated EISs of the AUT at the plurality of mapped sampling grid points comprises interpolating between two of the EIRP measurements or the EIS measurements.

3. The method of claim 1, wherein the first and second closed-surface geometric shapes comprise first and second spheres, respectively.

4. The method of claim 3, wherein mapping the plurality of second sampling grid points to the first closed-surface geometric shape comprises:

determining an angle between a direction of the offset from the rotation center of the test chamber and a line from the phase center of the AUT through each of the plurality of second sampling grid points, respectively, to the first sphere; and placing each mapped sampling grid point of the plurality of mapped sampling grid points on the first sphere where the line intersects the first sphere at the determined angle for each of the plurality of second sampling grid points, respectively.

5. The method of claim 4, wherein when the line from the phase center of the AUT through a second sampling grid point intersects the first sphere at two points, the mapped sampling grid point is placed on the first sphere at one of the two points closer to the second sampling grid point.

6. The method of claim 1, wherein scaling the estimated EIRPs or the estimated EISs at the plurality of mapped sampling grid points comprises:

determining ratios of (i) first distances between the phase center and each of the plurality of mapped sampling grid points, respectively, and (ii) second distances between the rotation center and each of the plurality of mapped sampling grid points, respectively; and multiplying each of the ratios by the estimated EIRPs or the estimated EISs at the plurality of mapped sampling grid points, respectively, to provide the scaled EIRPs or the scaled EISs, respectively.

7. The method of claim 6, wherein scaling the estimated EIRPs or the estimated EISs at the plurality of mapped sampling grid points further comprises:

compensating for off-axis differences in antenna gain of a probe antenna, used for performing the EIRP measurements or the EIS measurements of the AUT at the plurality of first sampling grid points, respectively, wherein the antenna gain is different for different directions between the probe antenna and the plurality of first sampling grid points, respectively.

8. A system for of determining corrected total radiated power (TRP) or corrected total isotropic sensitivity (TIS) of an antenna under test (AUT) in a near-field test chamber, the AUT having a phase center that is offset from a rotation center of the test chamber, the system comprising:

at least one probe antenna configured perform equivalent isotropic radiated power (EIRP) measurements or effective isotropic sensitivity (EIS) measurements of the AUT at a plurality of first sampling grid points, respectively, wherein the plurality of first sampling grid points are arranged on a first closed-surface geometric shape having a first center centered at the rotation center of the test chamber;

a processor device and a memory storing instructions that, when executed by the processor device, cause the processor device to:

map a plurality of second sampling grid points to the first closed-surface geometric shape to provide a plurality of mapped sampling grid points on the first closed-surface geometric shape, respectively, wherein the plurality of second sampling grid points are arranged on a second closed-surface geometric shape centered at the phase center of the AUT;

determine estimated EIRPs or estimated EISs of the AUT at the plurality of mapped sampling grid points using the EIRP measurements or EIS measurements at one or more first sampling grid points of the plurality of first sampling grid points;

scale the estimated EIRPs or the estimated EISs at the plurality of mapped sampling grid points to provide scaled EIRPs or the estimated EISs or scaled EISs at the plurality of second sampling grid points on the second closed-surface geometric shape, respectively, wherein the scaling compensates for path loss error; and calculate the corrected TRP or the corrected TIS of the AUT based on the scaled EIRPs or the scaled EISs, respectively, at the plurality of second sampling grid points on the second closed-surface geometric shape.

9. The system of claim 8, wherein the first sampling grid points are arranged on the first closed-surface geometric shape using a constant step size or a constant density.

10. The system of claim 8, wherein the instructions cause the processor device to determine the estimated EIRPs or the estimated EISs of the AUT at the plurality of mapped sampling grid points by interpolating between two of the EIRP measurements or the EIS measurements.

11. The system of claim 8, wherein the first and second closed-surface geometric shapes comprise first and second spheres, respectively.

12. The system of claim 8, wherein the instructions cause the processor device to map the plurality of second sampling grid points to the first closed-surface geometric shape by:

determining an angle between a direction of the offset from the rotation center of the test chamber and a line from the phase center of the AUT through each of the plurality of second sampling grid points, respectively, to the first closed-surface geometric shape; and placing each mapped sampling grid point of the plurality of mapped sampling grid points on the first closed-surface geometric shape where the line intersects the first closed-surface geometric shape at the determined angle for each of the plurality of second sampling grid points, respectively.

13. The system of claim 12, wherein when the line from the phase center of the AUT through a second sampling grid point intersects the first closed-surface geometric shape at two points, the mapped sampling grid point is placed on the first closed-surface geometric shape at one of the two points closer to the second sampling grid point.

14. The system of claim 8, wherein the instructions cause the processor device to scale the estimated EIRPs or the estimated EISs at the plurality of mapped sampling grid points by:

determining ratios of (i) first distances between the phase center and each of the plurality of mapped sampling grid points, respectively, and (ii) second distances between the rotation center and each of the plurality of mapped sampling grid points, respectively; and multiplying each of the ratios by the estimated EIRPs or the estimated EISs at the plurality of mapped sampling grid points, respectively, to provide the scaled EIRPs or the scaled EISs, respectively.

15. The system of claim 14, wherein the instructions further cause the processor device to scale the estimated EIRPs or the estimated EISs at the plurality of mapped sampling grid points by compensating for off-axis differences in antenna gain of a probe antenna, used for performing the EIRP measurements or the EIS measurements of the AUT at the plurality of first sampling grid points, respectively, wherein the antenna gain is different for different directions between the probe antenna and the plurality of first sampling grid points, respectively.

16. A non-transitory computer readable medium storing instructions for determining corrected total radiated power (TRP) or corrected total isotropic sensitivity (TIS) of an antenna under test (AUT) in a near-field test chamber, the AUT having a array phase center that is offset from a quiet zone center of a quiet zone in the test chamber by an offset distance, wherein when executed by a processor device, the instructions cause the processor device to execute a process comprising:

providing first sampling grid points arranged on a first sphere centered at the quiet zone center according to a constant step size or a constant density, wherein equivalent isotropic radiated power (EIRP) or effective isotropic sensitivity (EIS) of the AUT is measured at each of the first sampling grid point in a near-field of the test chamber;

providing second sampling grid points arranged arbitrarily on a second sphere centered at the array phase center;

mapping each second sampling grid point to the first sphere, using the offset distance and angle information from the array phase center to each of the second sampling grid points, respectively;

determining an interpolated EIRP or an interpolated EIS at each of the mapped second sampling grid points by interpolating between the measured EIRPs or the measured EISs at selected first sampling grid points for each of the mapped second sampling grid points on the first sphere, respectively;

scaling the interpolated EIRP or the interpolated EIS at each of the mapped second sampling grid points on the first sphere to provide a scaled EIRP or a scaled EIS, respectively, at each of the second sampling grid points on the second sphere; and calculating the corrected TRP or the corrected TIS of the AUT based on the scaled EIRPs or the scaled EISs, respectively, at the second sampling grid points on the second sphere.

17. The non-transitory computer readable medium of claim 16, wherein scaling the interpolated EIRP or the interpolated EIS at each of the mapped second sampling grid points comprises determining a ratio of (i) a first distance between the array phase center and the mapped second sampling grid point on the first sphere and (ii) a second distance between the quiet zone center and the mapped second sampling grid point on the first sphere.

18. The non-transitory computer readable medium of claim 16, wherein interpolating between the measured EIRPs or the measured EISs at the selected first sampling grid points for each of the mapped second sampling grid points comprises performing a linear fitting between the first sampling grid points immediately adjacent to each of the mapped second sampling grid points on the first sphere.

19. The non-transitory computer readable medium of claim 16, wherein mapping each second sampling grid point to the first sphere comprises:

determining an angle between a direction of the offset from the quiet zone center and a line from the array phase center of the AUT through each of the second sampling grid points, respectively, to the first sphere; and placing each mapped second sampling grid point of the mapped second sampling grid points on the first sphere where the line intersects the first sphere at the determined angle for each of the second sampling grid points, respectively.

20. The non-transitory computer readable medium of claim 19, wherein when the line from the array phase center of the AUT through a second sampling grid point intersects the first sphere at two points, the mapped sampling grid point is placed on the first sphere at one of the two points closer to the second sampling grid point.

* * * * *